(12) United States Patent
Zelsacher et al.

(10) Patent No.: US 10,670,972 B2
(45) Date of Patent: Jun. 2, 2020

(54) METHOD AND APPARATUS FOR EXPOSING A STRUCTURE ON A SUBSTRATE

(71) Applicant: Infineon Technologies AG, Neubiberg (DE)

(72) Inventors: Rudolf Zelsacher, Klagenfurt (AT); Peter Irsigler, Obernberg am Inn (AT)

(73) Assignee: Infineon Technologies AG, Neubiberg (DE)

( * ) Notice: Subject to any disclaimer, the term of this patent is extended or adjusted under 35 U.S.C. 154(b) by 581 days.

(21) Appl. No.: 14/304,665

(22) Filed: Jun. 13, 2014

(65) Prior Publication Data

US 2015/0362841 A1 Dec. 17, 2015

(51) Int. Cl.
*G03B 27/32* (2006.01)
*G03F 7/20* (2006.01)

(52) U.S. Cl.
CPC ...... *G03F 7/70425* (2013.01); *G03F 7/70283* (2013.01); *G03F 7/70291* (2013.01); *G03F 7/70325* (2013.01)

(58) Field of Classification Search
CPC ............. G03F 7/70291; G03F 7/70058; G03F 7/70283; G03F 7/703; G03F 7/70325; G03F 7/70375; G03F 7/70425; G03F 7/7045; G03F 7/70458; G03F 7/70466
USPC ............... 355/46, 52, 53, 55, 67–71, 75–77; 378/35; 430/5
See application file for complete search history.

(56) References Cited

U.S. PATENT DOCUMENTS

| | | | | |
|---|---|---|---|---|
| 5,329,335 A | * | 7/1994 | Wada | G03F 7/2002 355/53 |
| 5,438,204 A | * | 8/1995 | von Bunau | G03F 7/70283 250/492.2 |
| 6,356,340 B1 | * | 3/2002 | Spence | B82Y 10/00 355/53 |
| 6,879,376 B2 | * | 4/2005 | Case | G03F 7/70466 355/53 |
| 7,220,606 B2 | * | 5/2007 | Matsunami | G03F 1/38 257/E21.521 |
| 7,684,008 B2 | | 3/2010 | De Smit et al. | |
| 7,956,983 B2 | * | 6/2011 | Nam | B82Y 10/00 355/46 |
| 2003/0095243 A1 | | 5/2003 | Yu et al. | |

(Continued)

FOREIGN PATENT DOCUMENTS

CN 1637608 A 7/2005
CN 101751502 A 6/2010

(Continued)

OTHER PUBLICATIONS

Waldbaur, A., "Development of a maskless lithography system for photo use in rapid prototyping in the microfluidic and surface functionalization for targeted," Thesis, Writings of the Institute of Microstructure Technology Karlsruher Institute of Technology (KIT), vol. 19, Sep. 26, 2013, pp. 26-33.

*Primary Examiner* — Christina A Riddle
(74) *Attorney, Agent, or Firm* — Slater Matsil, LLP

(57) ABSTRACT

A method for exposing a structure on a substrate includes positioning of an invariable reticle and a programmable reticle in a light path between a light source and a layer on a substrate to be exposed to light and exposing the layer on the substrate by light from the light source passing the invariable reticle and the programmable reticle.

17 Claims, 2 Drawing Sheets

(56) References Cited

U.S. PATENT DOCUMENTS

| | | | |
|---|---|---|---|
| 2003/0128347 A1* | 7/2003 | Case | G03F 7/70283 355/53 |
| 2003/0214571 A1* | 11/2003 | Ishikawa | B23K 26/0604 347/255 |
| 2006/0192789 A1* | 8/2006 | Baba-Ali | G03F 7/70291 345/606 |
| 2006/0215137 A1 | 9/2006 | Hasegawa et al. | |
| 2006/0216869 A1 | 9/2006 | Huizer et al. | |
| 2006/0286482 A1* | 12/2006 | Sewell | G03F 7/70958 430/270.1 |
| 2007/0066367 A1* | 3/2007 | Kallscheuer | G11C 29/006 460/5 |
| 2008/0245975 A1 | 10/2008 | Miller | |
| 2009/0315193 A1* | 12/2009 | Ortner | H01L 23/544 257/797 |
| 2010/0162197 A1 | 6/2010 | Ye et al. | |
| 2012/0092632 A1* | 4/2012 | McLeod | G03F 7/031 355/53 |

FOREIGN PATENT DOCUMENTS

| | | |
|---|---|---|
| CN | 202453606 U | 9/2012 |
| JP | 2011119596 A | 6/2011 |
| WO | 9705526 | 2/1997 |

\* cited by examiner

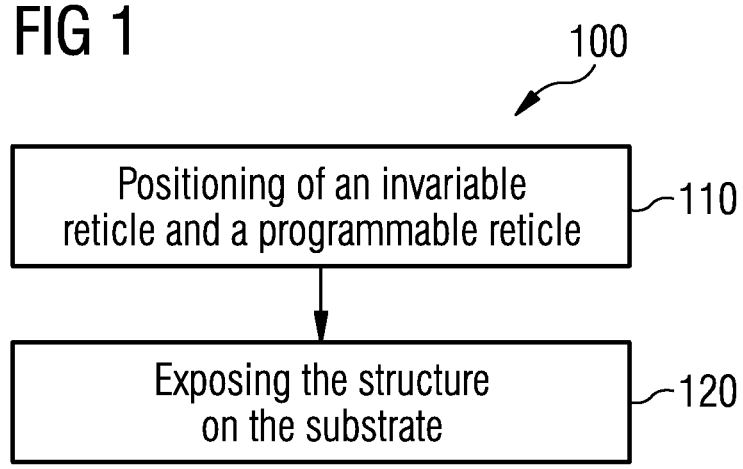
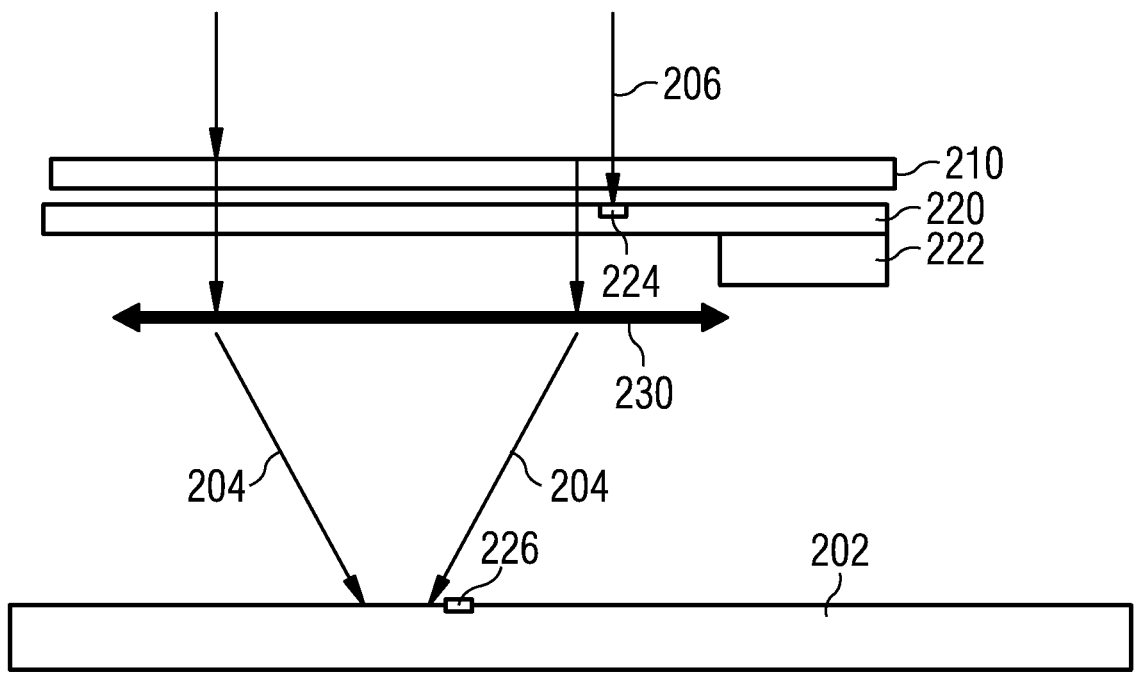

METHOD AND APPARATUS FOR EXPOSING A STRUCTURE ON A SUBSTRATE

TECHNICAL FIELD

Embodiments relate to photolithographic manufacturing processes and in particular to a method and an apparatus for exposing a structure on a substrate.

BACKGROUND

The exposure of structures to be manufactured on substrates can be done in various ways. Usually different invariable reticles are used for exposing different layers on a substrate. Alternatively, a reticle-less exposure may be enabled by an electron beam or ion beam writing apparatus. However, such an electron beam or ion beam exposure is slow and expensive. It is desired to provide a flexible concept for fast exposure of structures on a substrate at low costs.

SUMMARY

Some embodiments relate to a method for exposing a structure on a substrate. The method comprises positioning of an invariable reticle and a programmable reticle in a light path between a light source and a layer on a substrate to be exposed to light and exposing the layer on the substrate by light from the light source passing the invariable reticle and the programmable reticle.

Some further embodiments relate to an apparatus for exposing a semiconductor substrate comprising a light source, a first reticle carrier configured to carry an invariable reticle, a second reticle carrier configured to carry a programmable reticle and a substrate carrier configured to carry a substrate.

BRIEF DESCRIPTION OF THE DRAWINGS

Some embodiments of apparatuses and/or methods will be described in the following by way of example only, and with reference to the accompanying figures, in which FIG. 1 shows a flow chart of method for exposing a structure on a substrate;

FIG. 2 shows a schematic illustration of an exposure of a structure on a wafer;

DETAILED DESCRIPTION OF ILLUSTRATIVE EMBODIMENTS

Figure 3:
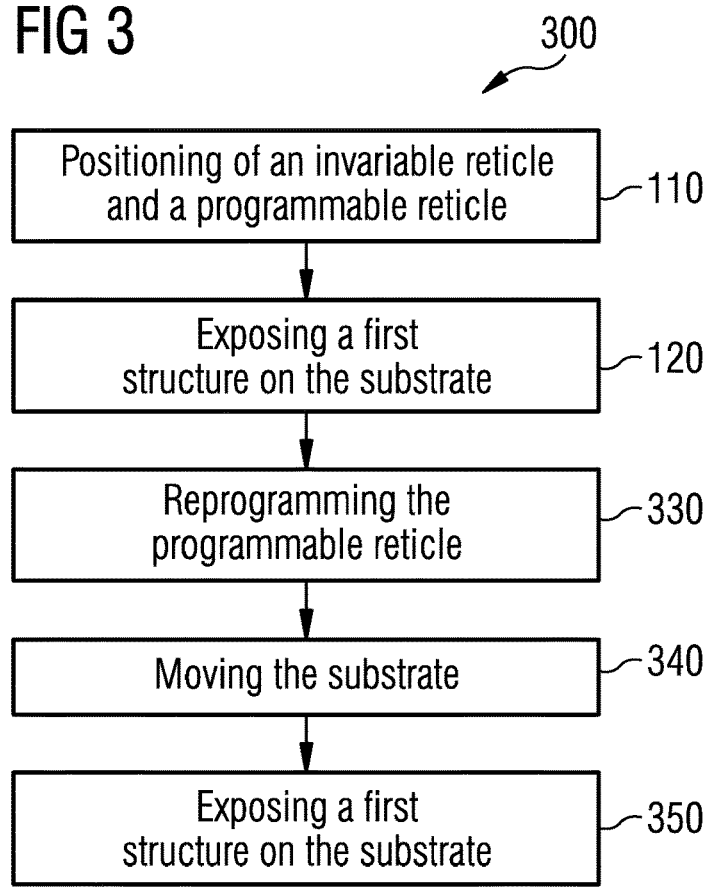
FIG. 3 shows a flow chart of method for exposing structures on a substrate.

Various example embodiments will now be described more fully with reference to the accompanying drawings in which some example embodiments are illustrated. In the figures, the thicknesses of lines, layers and/or regions may be exaggerated for clarity.

Accordingly, while further embodiments are capable of various modifications and alternative forms, some example embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of further example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, acts, operations, elements and/or components, but do not preclude the presence or addition of one or more other features, integers, acts, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 1 shows a flow chart of method 100 for exposing a structure on a substrate according to an embodiment. The method 100 comprises positioning 110 (e.g., aligning the reticles to each other and/or to the substrate) of an invariable reticle and a programmable reticle in a light path between a light source and a layer on a substrate to be exposed to light and exposing 120 the layer on the substrate by light from the light source passing the invariable reticle and the programmable reticle.

The simultaneous usage of an invariable reticle and a programmable reticle may enable a flexible exposure of different structures caused by different settings of the programmable reticle, while equal structures may be caused by the invariable reticle (e.g., providing the possibility of exposing smaller structures than with the programmable reticle).

The substrate may comprise or consist of any solid material (e.g., semiconductor material, glass or polymer). The substrate may comprise a disc-shaped geometry (e.g., wafer, die or circuit board). The substrate may be a semiconductor substrate (e.g., a silicon-based semiconductor substrate, a silicon carbide-based semiconductor substrate, a gallium arsenide-based semiconductor substrate or a gallium nitride-based semiconductor substrate). For example, the substrate may be a silicon wafer.

A layer to be exposed may be any light sensitive layer necessary to manufacture a desired device. For example, a photoresist layer deposited on the substrate or on a layer (e.g., insulation layer or metal layer) on the substrate may be the layer to be exposed. For example, an exposed photoresist layer may be used as mask for reproducing exposed structures on the substrate (e.g., different doping regions) or by an insulation layer (e.g., holes for vias) or a metal layer (e.g., on-chip wiring) by additional manufacturing processes (e.g., implant, etch or deposition). In an example, exposing a layer on the substrate may be done by exposing a photoresist layer by a structure defined by structures on the invariable reticle and/or the programmable reticle.

An exposure may be an illumination of the substrate or a layer deposited on the substrate by light emitted by a light source (e.g., visible light or deep ultra violet light). A light source may be an ultraviolet light from gas-discharge lamps using mercury, or in combination with noble gases such as xenon. These lamps may produce light across a broad spectrum with several strong peaks in the ultraviolet range. This spectrum may be filtered to select a single spectral line. For example, lines at 436 nm ("g-line"), 405 nm ("h-line") and/or 365 nm ("i-line") may be used. Alternatively, the light source may be an excimer laser (e.g., a deep ultraviolet excimer lasers like a krypton fluoride laser at 248 nm wavelength or an argon fluoride laser at 193 nm wavelength).

The invariable reticle or invariable photo mask may be a mask comprising invariable structures. In other words, structures on the invariable reticle may be at least invariable during the exposure of structures or within a used exposure apparatus (e.g., which excludes mask repair processes by focused ion beam). The invariable reticle comprises transparent areas and opaque areas so that light emitted by a light source can substantially pass the invariable reticle through the transparent areas only. For example, the invariable reticle may comprise transparent fused silica blanks covered with a pattern defined with a chrome metal-absorbing film.

The programmable reticle or programmable photo mask may be a mask comprising means for changing a transparency of at least a part of the programmable reticle. In this way, structures of different geometry may be exposable at different times by using the same programmable reticle. For example, the programmable reticle comprises an array of pixels with controllable transparency (e.g., by applying different voltages to the pixels at different times).

For example, each pixel of the array of pixels may comprise a state being either a transparent state (e.g., more than 70%, more than 80% or more than 90% of the light for exposing structures is able to pass) or an opaque state (e.g., less than 10%, less than 5% or less than 1% of the light for exposing structures is able to pass) during exposure of the structure on the substrate. Alternatively, pixels of the array of pixels may also comprise intermediate states (e.g., between 10% and 90% of the light for exposing structures is able to pass) to provide different light intensity to different parts of the structure to be exposed.

For example, the programmable reticle may comprise an array of liquid crystal cells (e.g., LCD display) or an array of micro mirror cells (e.g., digital light processing array).

The invariable reticle may be arranged closer to the light source than the programmable reticle so that the light for exposure passes the invariable reticle before the programmable reticle. Alternatively, the programmable reticle may be arranged closer to the light source than the invariable reticle so that the light for exposure passes the programmable reticle before the invariable reticle.

The invariable reticle can be used for exposing very small structures. The structure size, which can be exposed with the programmable reticle may be limited by the number and size of programmable areas. Therefore, a minimal structure size (e.g., smaller than 500 nm, smaller than 100 nm or smaller than 100 nm) of structures exposed on the layer on the substrate resulting from structures on the invariable reticle may be smaller than a minimal structure size of structures exposed on the layer on the substrate resulting from structures on the programmable reticle. For example, a minimal structure size of structures exposed on the layer on the substrate resulting from structures on the programmable reticle is smaller than 5 µm (e.g., smaller than 10 µm, smaller than 5 µm smaller than 2 µm). The minimal structure size of structures exposed on the layer on the substrate resulting from structures on the programmable reticle may depend on the resolution of a used array of liquid crystal cells (e.g., more than 100 ppi, more than 500 ppi or more than 1000 ppi).

Optionally, the method 100 may further comprise scaling down structures on the invariable reticle and the programmable reticle by an optical unit to reproduce scaled down structures on the layer on the substrate. In this way, the minimal structure size of structures exposed on the layer on the substrate may be further reduced. For example, a scaling of 1:4 or 1:5 may be implemented.

For example, the programmable reticle may be used to control or enable an exposure of a lot-wafer-chip code structure, a repair structure, different designs on one wafer or a fuse programming structure.

FIG. 2 shows an example of an exposure of a structure on a wafer 202. For the exposure of the wafer 202, a (invariable) reticle 210 and a programmable reticle 220 (e.g., LCD) with control electronic 222 is arranged within the light path. Further, a stepper optic 230 (e.g., optical unit used by a stepper apparatus) is arranged between the programmable reticle 220 and the wafer 202. Such an optical unit may be unnecessary, if the exposure is done with a mask aligner (e.g., exposing the whole wafer at one time).

Additionally, FIG. 2 indicates two light beams 204 passing the invariable reticle 210 and the programmable reticle 220 at transparent parts of the invariable reticle 210 and the programmable reticle 220 and exposing the wafer. Further, a third light beam 206 is indicated, which is blocked by an opaque part 224 (pixel) of the programmable reticle 220 resulting in an unexposed area 226 on the wafer.

For example, FIG. 2 shows the usage of an LCD reticle for non-ambiguous chip labeling. The LCD pixels may be used for (forming a) chip identification.

More details and aspects are mentioned in connection with embodiments described above or below. The embodiment shown in FIG. 2 may comprise one or more optional additional features corresponding to one or more aspects mentioned in connection with the proposed concept or one or more embodiments described above or below (e.g., FIG. 1).

Optionally, the programmable reticle is reprogrammed and used repeatedly. FIG. 3 shows a flow chart of a method 300 for exposing a structure on a substrate according to an embodiment. The method 300 comprises positioning 110 (e.g., aligning the reticles to each other and/or to the substrate) of an invariable reticle and a programmable reticle in a light path between a light source and a layer on a substrate to be exposed to light and exposing 120 a first structure on the layer on the substrate by light from the light source passing the invariable reticle and the programmable reticle. Further, the method 300 comprises reprogramming 330 the programmable reticle to expose different structures before and after the reprogramming of the programmable reticle and optionally moving 340 the substrate relative to the programmable reticle (e.g., by moving the substrate or the programmable reticle). Additionally, the method 300 comprises exposing 350 a second structure by light from the light source passing the invariable reticle and the programmable reticle (optionally after the movement).

For example, the programmable reticle may be programmed to enable exposure of first structures during exposure of a first part of the layer on the substrate and may be programmed to enable exposure of second structures during exposure of a second part of the layer on the substrate. The first structures may be different from the second structures. In this way, different parts of the same photoresist layer may be exposed by different structures, for example. For example, an individual lot-wafer-chip labeling may be enabled.

Alternatively or additionally, the programmable reticle may be programmed to enable exposure of first structures during exposure of at least a part of a first layer on the substrate and may be programmed to enable exposure of second structures during exposure of at least a part of a second layer on the substrate. The first structures may be different from the second structures. In this way, the programmable reticle may be used for exposing different structures on different photoresist layers, for example.

For example, the programmable reticle may be programmed by a control unit controlling the transparency of the pixels of the programmable reticle.

More details and aspects are mentioned in connection with embodiments described above or below. The embodiment shown in FIG. 3 may comprise one or more optional additional features corresponding to one or more aspects mentioned in connection with the proposed concept or one or more embodiments described above or below (e.g., FIG. 1).

Figure 4:
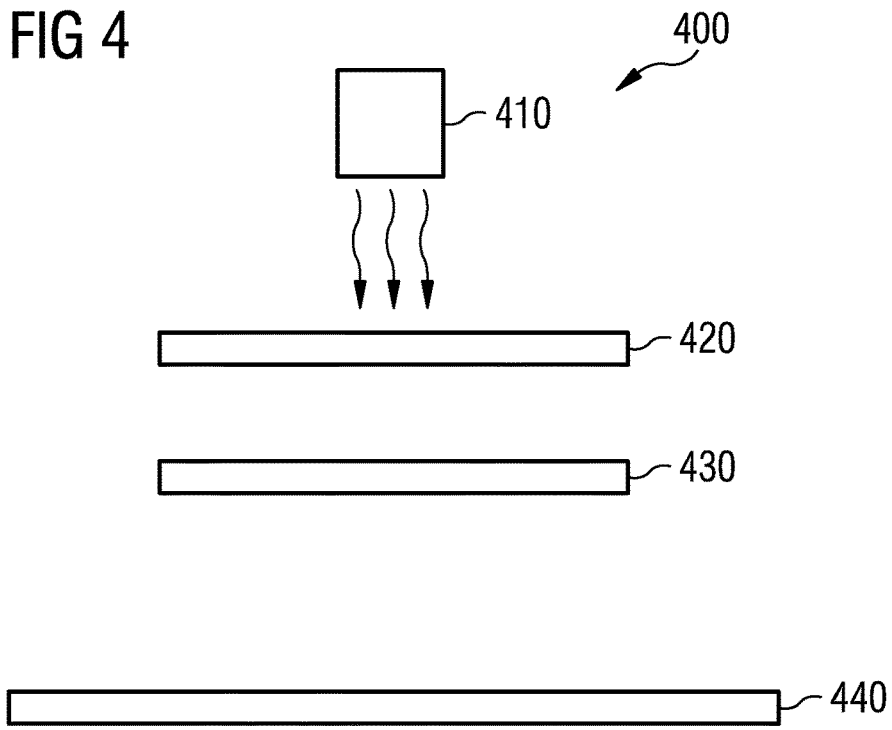
FIG. 4 shows a schematic illustration of an apparatus for exposing a structure on a substrate.

FIG. 4 shows a schematic illustration of an apparatus 400 for exposing a structure on a substrate according to an embodiment. The apparatus 400 comprises a light source 410, a first reticle carrier 420 configured to carry an invariable reticle, a second reticle carrier 430 configured to carry a programmable reticle and a substrate carrier 440 configured to carry a substrate.

The simultaneous usage of an invariable reticle and a programmable reticle may enable a flexible exposure of different structures caused by different settings of the programmable reticle, while equal structures may be caused by the invariable reticle (e.g., providing the possibility of exposing smaller structures than with the programmable reticle). Such an exposure may be enabled by the apparatus 400.

The first reticle carrier 420 may be a fixture for an invariable reticle. The first reticle carrier 420 may be arranged moveable (e.g., for loading the invariable reticle and/or moving relative to the substrate carrier) or immovable within the apparatus 400.

The second reticle carrier 430 may be a fixture for a programmable reticle. Optionally, the second reticle carrier 430 may be implemented to carry also a reticle control module for programming the programmable reticle. The second reticle carrier 430 may be arranged moveable (e.g., for loading the programmable reticle and/or moving relative to the substrate carrier) or immovable within the apparatus 400.

The substrate carrier 440 may be a fixture for a substrate to be exposed. The substrate carrier 440 may be arranged moveable (e.g., for loading the substrate and/or moving relative to the programmable reticle and/or the invariable reticle) or immovable within the apparatus 400.

The light source 410, the first reticle carrier 420, the second reticle carrier 430 and the substrate carrier 440 may be arranged to enable exposing a layer on a substrate carried by the substrate carrier 440 by light from the light source 410 passing an invariable reticle carried by the first reticle carrier 420 and a programmable reticle carried by the second reticle carrier 430.

Optionally, the apparatus 400 may comprise a reticle control module providing a control signal for controlling a programming of a programmable reticle carried by the second reticle carrier 430. Alternatively, the reticle control module may be part of the programmable reticle and the second reticle carrier 430 may be configured to carry the programmable reticle 220 (see FIG. 2) with the reticle control module. The apparatus 400 and/or the reticle control module may be configured to provide wireless or wired external access (e.g., for external control) to the reticle control module.

Optionally, the programmable reticle may comprise an array of liquid crystal cells or an array of micro mirror cells.

Additionally, the apparatus 400 may further comprise an optical unit configured to scale down structures on the invariable reticle and the programmable reticle to reproduce scaled down structures on the layer on the substrate.

For example, the apparatus 400 may be a stepper or a mask aligner.

More details and aspects (e.g., regarding the light source, the invariable reticle, the programmable reticle and the substrate) are mentioned in connection with embodiments described above (e.g., FIG. 1, 2 or 3) or below. The embodiment shown in FIG. 4 may comprise one or more optional additional features corresponding to one or more aspects mentioned in connection with the proposed concept or one or more embodiments described above or below (e.g., FIG. 1, 2 or 3).

Some embodiments relate to a programmable reticle. The proposed concept may enable structuring resist, while the resist structure is changed shot to shot. A shot may be an exposure by a stepper. A wafer may be exposed with a certain number of shots so that periodical resist structures may be formed on the wafer surface. Different images or structures may be reproduced on the wafer by the programmable reticle from shot to shot. These resist structures may be used for lot-wafer-chip-coding, repair of metal layers or programming of fuses, for example. Further, a double exposure may be performed. In other words, resist may be applied to the wafer and a layer (e.g., poly) may be exposed (e.g., all shots equal) and then the resist may be exposed a second time with the programmable reticle (e.g., to write a chip identification into the resist). For example, a lot-wafer-chip coding may be implemented on power devices, because a complex coding by fuses may be impossible, expensive or difficult.

Liquid crystal displays LCD are able to control the transparency for each pixel. An LCD may be able to provide the necessary contrast at the used exposure wave lengths (e.g., gline, iline or deep ultra violet DUV) and the LCD internal wiring may be invisible. The LCD may be mounted to a reticle frame (reticle carrier) together with a control unit, a current source, a date transmitter and/or a data receiver, for example. In this way, different images may be triggered on the LCD for (each) shot and a chip to chip different resist structure may be obtained. Chip to chip, since different structures are manufactureable at each position of a chip by the programmable reticle. The method may be applicable to mask aligners too.

An LCD projector provides an enlarged image, which is generated on the LCD. The proposed concept may scale down an image generated by an LCD, which may be projected on a lacquered wafer (wafer coated with photoresist). A structure may be generated pixel to pixel in a metal surface on a (invariable) reticle. In contrast, the pixels on a programmable reticle may be generated by applying a voltage. In this way a very flexible lithography process may be obtained. Further, the DMD (digital micromirror device) technology may be another possibility for implementing a programmable reticle.

The proposed concept may be used for labeling of chips with lot number, wafer number and/or coordinates on the wafer to ensure die traceability (e.g., for returns or experiments), for fast redesign of layers at the product development, for enabling different designs on one wafer for product development, for building up connections at devices and/or interrupting connections on devices (e.g., to enable measurements on single components or functional blocks at a measurement site by hand), for manufacturing small series without permanent chrome reticle, for fusing by lithography (e.g., laser-cutting is DD producer) and/or for testing process windows, for example.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for exposing a structure on a substrate, the method comprising:
    positioning an invariable reticle and a programmable reticle in a single light path between a first light source and a layer on the substrate, the layer to be exposed to light; and
    exposing the layer on the substrate by light from the first light source passing through both the invariable reticle and the programmable reticle.

2. The method of claim 1, wherein the programmable reticle comprises an array of pixels with controllable transparency.

3. The method of claim 2, wherein each pixel of the array of pixels comprises a state that is either a transparent state or an opaque state during exposure of the layer on the substrate.

4. The method of claim 1, wherein the programmable reticle comprises an array of liquid crystal cells or an array of micro mirror cells.

5. The method of claim 1, wherein a minimal structure size of structures exposed on the layer on the substrate resulting from structures on the invariable reticle is smaller than a minimal structure size of structures exposed on the layer on the substrate resulting from structures on the programmable reticle.

6. The method of claim 1, wherein a minimal structure size of structures exposed on the layer on the substrate resulting from structures on the programmable reticle is smaller than 5 µm.

7. The method of claim 1, further comprising scaling down structures on the invariable reticle and the programmable reticle using an optical unit to reproduce scaled down structures on the layer on the substrate.

8. The method of claim 1, further comprising moving the substrate relative to the programmable reticle.

9. The method of claim 8, further comprising exposing a second structure on the layer on the substrate by light from the first light source passing the invariable reticle and the programmable reticle after the moving.

10. The method of claim 1, further comprising reprogramming the programmable reticle to obtain different structures on the same or different layers on the substrate before and after the reprogramming of the programmable reticle.

11. The method of claim 1, wherein the programmable reticle is programmed to enable exposure of first structures during exposure of a first part of the layer on the substrate and is programmed to enable exposure of second structures during exposure of a second part of the layer on the substrate, wherein the first structures are different from the second structures.

12. The method of claim 1, wherein the programmable reticle is programmed to enable exposure of first structures during exposure of at least a part of a first layer on the substrate and is programmed to enable exposure of second structures during exposure of at least a part of a second layer on the substrate, wherein the first structures are different from the second structures.

13. The method of claim 1, wherein the programmable reticle is used to control an exposure of a lot-wafer-chip code structure, a repair structure or a fuse programming structure.

14. An apparatus for exposing a structure on a substrate, the apparatus comprising:
a first light source;
a first reticle carrier configured to carry an invariable reticle;
a second reticle carrier configured to carry a programmable reticle; and
a substrate carrier configured to carry a substrate,
wherein the first light source, the first reticle carrier, the second reticle carrier and the substrate carrier are arranged to enable exposing a layer on the substrate carried by the substrate carrier by light from the first light source passing through both the invariable reticle carried by the first reticle carrier and the programmable reticle carried by the second reticle carrier.

15. The apparatus of claim 14, further comprising a reticle control module configured to provide a control signal to control a programming of the programmable reticle carried by the second reticle carrier.

16. The apparatus of claim 15, wherein the programmable reticle comprises an array of liquid crystal cells or an array of micro mirror cells.

17. The apparatus of claim 14, further comprising an optical unit configured to scale down structures on the invariable reticle and the programmable reticle to reproduce scaled down structures on the layer on the substrate.

* * * * *